(12) United States Patent  (10) Patent No.: US 8,872,611 B2
Rouaud et al.  (45) Date of Patent: Oct. 28, 2014

(54) ROGOWSKI COIL ASSEMBLIES AND METHODS FOR PROVIDING THE SAME

(75) Inventors: Didier Gilbert Rouaud, Kennesaw, GA (US); Subramanyam Satyasurya Chamarti, Kennesaw, GA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/212,818

(22) Filed: Aug. 18, 2011

(65) Prior Publication Data

US 2013/0043967 A1 Feb. 21, 2013

(51) Int. Cl.
*H01F 5/00* (2006.01)
*H01F 27/28* (2006.01)
*G01R 15/18* (2006.01)

(52) U.S. Cl.
CPC .................................. *G01R 15/181* (2013.01)
USPC ......................................... 336/200; 336/232

(58) Field of Classification Search
USPC ................................................. 336/200, 232
See application file for complete search history.

(56) References Cited

U.S. PATENT DOCUMENTS

| | | | |
|---|---|---|---|
| 4,616,176 A | 10/1986 | Mercure et al. | |
| 5,414,400 A | 5/1995 | Gris et al. | |
| 5,442,280 A | 8/1995 | Baudart | |
| 5,461,309 A | 10/1995 | Baudart | |
| 5,982,265 A | 11/1999 | Van Skarczinski et al. | |
| 6,094,044 A | 7/2000 | Kustera et al. | |
| 6,313,623 B1 | 11/2001 | Kojovic et al. | |
| 6,614,218 B1 | 9/2003 | Ray | |
| 6,731,193 B2 | 5/2004 | Meier et al. | |
| 6,822,547 B2 | 11/2004 | Saito et al. | |
| 7,106,162 B2 | 9/2006 | Saito | |
| 7,227,441 B2 | 6/2007 | Skendzic et al. | |
| 7,253,603 B2 | 8/2007 | Kovanko et al. | |
| 7,474,192 B2 | 1/2009 | Skendzic et al. | |
| 7,538,541 B2 | 5/2009 | Kojovic | |
| 2003/0112000 A1 | 6/2003 | Sorenson, Jr. | |
| 2004/0257061 A1 | 12/2004 | George de Buda | |
| 2005/0248430 A1 | 11/2005 | Dupraz et al. | |
| 2005/0253573 A1* | 11/2005 | Budillon et al. | 324/126 |
| 2006/0220774 A1* | 10/2006 | Skendzic | 336/200 |
| 2007/0152651 A1 | 7/2007 | Shiokawa et al. | |
| 2007/0285089 A1* | 12/2007 | Ibuki et al. | 324/260 |
| 2007/0290695 A1 | 12/2007 | Mahon | |
| 2008/0007249 A1* | 1/2008 | Wilkerson et al. | 324/127 |
| 2008/0036448 A1 | 2/2008 | Kovach et al. | |
| 2008/0079418 A1 | 4/2008 | Rea et al. | |
| 2008/0106253 A1 | 5/2008 | Kojovic | |
| 2008/0211484 A1 | 9/2008 | Howell et al. | |
| 2011/0025304 A1 | 2/2011 | Lint et al. | |
| 2011/0025305 A1 | 2/2011 | Lint et al. | |
| 2011/0148561 A1 | 6/2011 | Lint et al. | |
| 2013/0043967 A1 | 2/2013 | Rouaud et al. | |
| 2013/0063125 A1 | 3/2013 | Chamarti et al. | |
| 2013/0063129 A1 | 3/2013 | Chamarti et al. | |
| 2013/0063131 A1 | 3/2013 | Chamarti et al. | |
| 2013/0063161 A1 | 3/2013 | Chamarti et al. | |

FOREIGN PATENT DOCUMENTS

CN 201465698 U * 5/2010

OTHER PUBLICATIONS

Search Report issued in connection with EP Application No. 12180314.2, Nov. 29, 2012.
European search report for EP12180314 dated Nov. 29, 2012.
Co-pending U.S. Appl. No. 13/229,002, filed Sep. 9, 2011, entitled Sensor Devices and Methods for Use in Sensing Current Through a Conductor, by Chamarti et al.
Co-pending U.S. Appl. No. 13/228,968, filed Sep. 9, 2011, entitled Sensor Devices and Methods for Use in Sensing Current Through a Conductor, by Chamarti et al.
Co-pending U.S. Appl. No. 13/228,924, filed Sep. 9, 2011, entitled Sensor Devices and Methods for Use in Sensing Current Through a Conductor, by Chamarti et al.
Co-pending U.S. Appl. No. 13/229,038, filed Sep. 9, 2011, entitled Sensor Devices and Methods for Use in Sensing Current Through a Conductor, by Chamarti et al.

* cited by examiner

*Primary Examiner* — Tsz Chan

(74) *Attorney, Agent, or Firm* — Sutherland Asbill & Brennan LLP

(57) ABSTRACT

Rogowski coil assemblies and methods for providing or forming Rogowski coil assemblies are provided. A Rogowski coil assembly may include a printed circuit board and a plurality of Rogowski coil sections mounted to an external surface of the printed circuit board by one or more respective circuit traces. The circuit traces may retain and connect the plurality of Rogowski coil sections.

8 Claims, 2 Drawing Sheets

ROGOWSKI COIL ASSEMBLIES AND METHODS FOR PROVIDING THE SAME

FIELD OF THE INVENTION

Embodiments of the invention relate generally to Rogowski coils, and more specifically to Rogowski coil assemblies in which a plurality of Rogowski coil sections are mounted on a printed circuit board.

BACKGROUND OF THE INVENTION

A wide variety of different types of measurement devices are utilized to detect or monitor current signals. For example, measurement devices are typically integrated into utility meters in order to monitor the current on one or more phases of an electrical power signal. In conventional devices, current transformers, shunts, and Hall Effect transducers were traditionally used to monitor current signals. More recently, Rogowski coils have been utilized to monitor current signals. With a Rogowski coil, current flowing through a conductor generates a magnetic field that induces a voltage in the coil. Using the voltage output signal of the coil, current conditions within the conductor can be calculated.

Conventional Rogowski coils are typically housed within a plastic casing or plastic molding. Although the casing serves to hold the windings of the coils together, the casing increases the size and cost of Rogowski coil assemblies. For example, the Rogowski coil assemblies take up more space within a utility meter. Attempts have been made to reduce the size of Rogowski coil assemblies by integrating or etching coils into a printed circuit board. For example, U.S. Patent Publication No. 2008/0079418 to Rea, et al., entitled "High-Precision Rogowski Current Transformer" and filed on Sep. 29, 2006, describes a Rogowski coil assembly that is integrated into a printed circuit board. However, measurement sensitivity is often sacrificed due to an inability to achieve an acceptable number of windings or turns for the etched Rogowski coils. Accordingly, improved Rogowski coil assemblies are desirable.

BRIEF DESCRIPTION OF THE INVENTION

Some or all of the above needs and/or problems may be addressed by certain embodiments of the invention. Embodiments of the invention may include Rogowski coil assemblies and methods for forming the same. According to one embodiment of the invention, there is disclosed a Rogowski coil assembly. The Rogowski coil assembly may include a printed circuit board and a plurality of Rogowski coil sections mounted to an external surface of the printed circuit board by one or more respective circuit traces. The circuit traces may retain and connect the plurality of Rogowski coil sections.

According to another embodiment of the invention, there is disclosed a method for providing a Rogowski coil assembly. A printed circuit board may be provided, and a plurality of Rogowski coil sections may be mounted to an external surface of the printed circuit board by one or more respective circuit traces. The circuit traces may retain and connect the plurality of Rogowski coil sections.

Additional systems, methods, apparatus, features, and aspects are realized through the techniques of various embodiments of the invention. Other embodiments and aspects of the invention are described in detail herein and are considered a part of the claimed invention. Other embodiments, features, and aspects can be understood with reference to the description and the drawings.

BRIEF DESCRIPTION OF THE DRAWINGS

Figure 1:
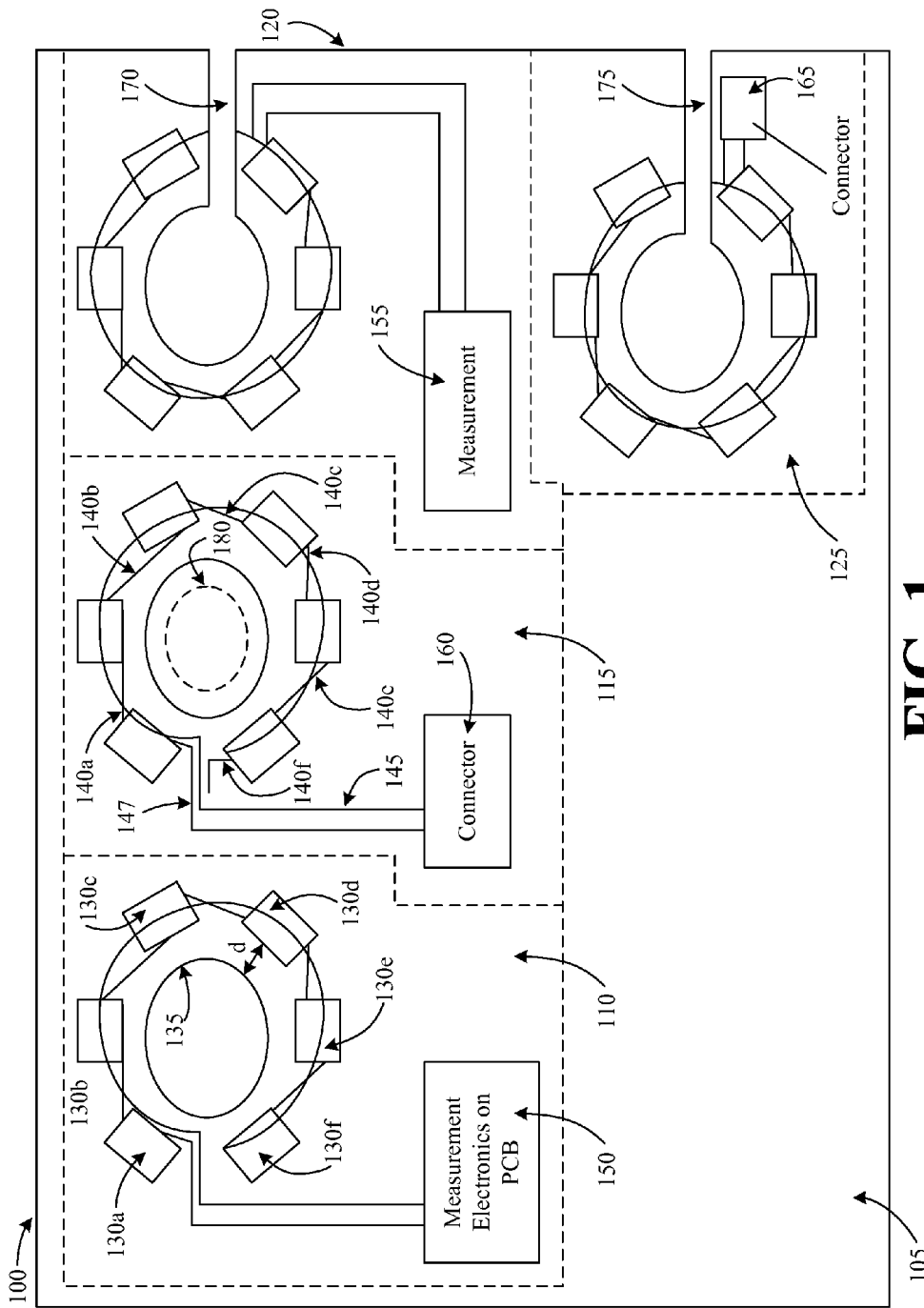

Having thus described the invention in general terms, reference will now be made to the accompanying drawings, which are not necessarily drawn to scale, and wherein:

FIG. 1 is a block diagram of example Rogowski coil assemblies, according to an illustrative embodiment of the invention.

Figure 2:
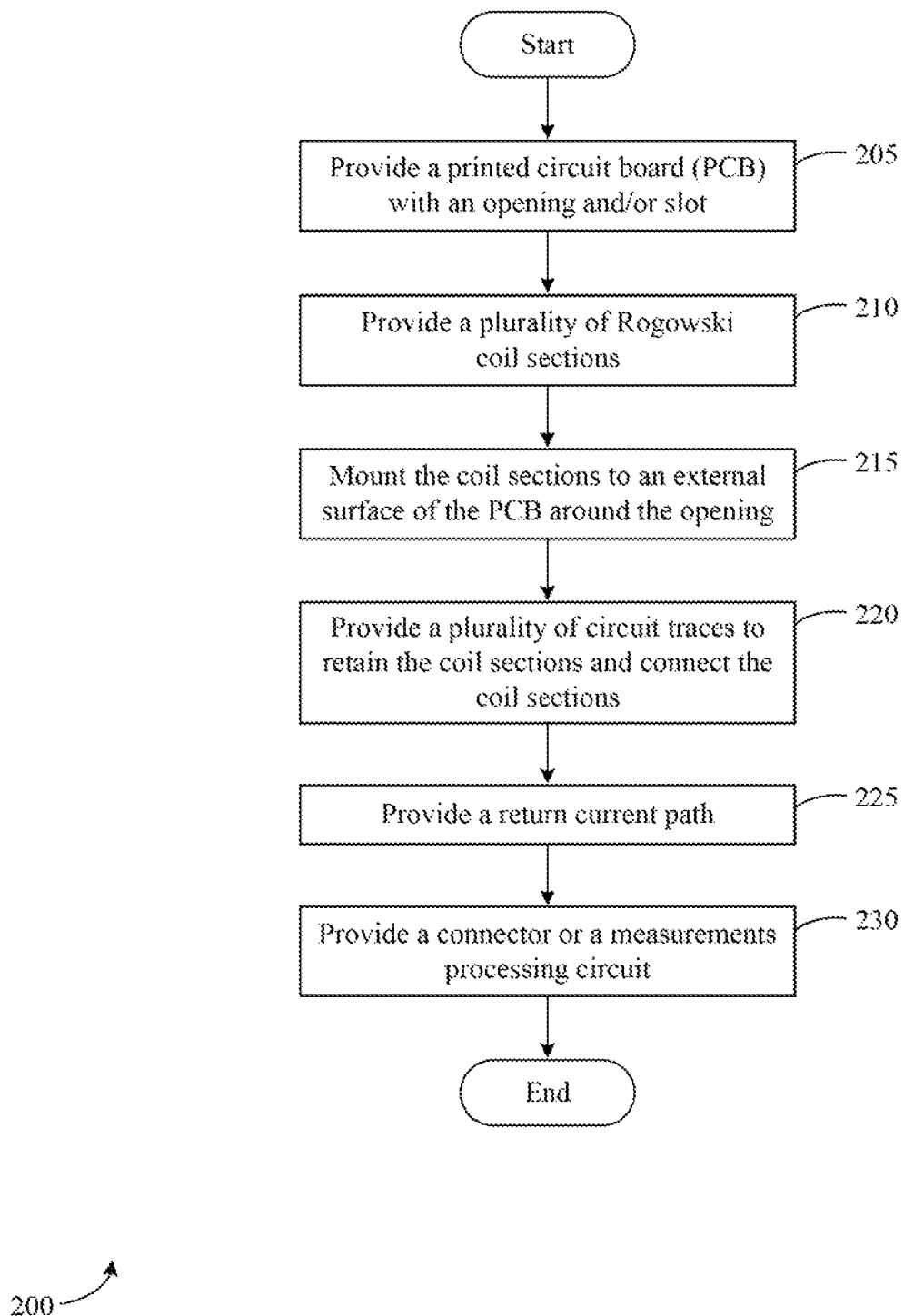

FIG. 2 is a flow diagram of an example method for providing a Rogowski coil assembly, according to an illustrative embodiment of the invention.

DETAILED DESCRIPTION OF THE INVENTION

Illustrative embodiments of the invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

Disclosed are Rogowski coil assemblies and methods of providing and/or forming the same. In one example embodiment of the invention, a Rogowski coil assembly may include a printed circuit board and a plurality of Rogowski coil sections mounted to an external surface of the printed circuit board by one or more respective circuit traces. In other words, Rogowski coil sections that form a Rogowski coil may be soldered to the printed circuit board or otherwise attached to the printed circuit board using any number of suitable circuit traces. The circuit traces may retain or hold the Rogowski coil sections in place and inhibit the unwinding of the coil sections. Additionally, the circuit traces may connect the Rogowski coil sections together by forming conductive pathways between the Rogowski coil sections. Any number of Rogowski coil sections may be utilized as desired in various embodiments of the invention. For example, approximately three to twelve Rogowski coil sections may be utilized. In one example embodiment, six Rogowski coil sections may be utilized. In other embodiments, such as embodiments utilized in power substations, more than twelve Rogowski coil sections may be utilized.

As desired in certain embodiments, a return current path for the Rogowski coil sections may also be provided. For example, a return current path may be provided by one or more current traces on the printed circuit board, such as a current trace formed on a surface of the printed circuit board opposite the surface on which the Rogowski coil sections are mounted (e.g., the reverse side of the printed circuit board). As another example, a return current path may be provided by a conductor or wire that passes through one or more of the Rogowski coil sections. For example, a return path conductor may be passed through the center of the plurality of Rogowski coil sections.

In certain embodiments of the invention, an opening may be provided in the printed circuit board to receive at least one conductor that is monitored by the plurality of Rogowski coil sections. For example, a circular or an elliptical opening may be formed through the printed circuit board. As desired, the Rogowski coil sections may be positioned about or around a periphery of the opening. For example, each of the Rogowski coil sections may be positioned an approximately equal distance from the opening and/or from a center of the opening. In this regard, the Rogowski coil sections may be utilized to monitor a current within the at least one conductor once the at least one conductor is inserted into or passed through the opening. Additionally, in certain embodiments, a capacitive shielding may be positioned within the opening between the at least one conductor and the printed circuit board. Additionally, as desired in certain embodiments, a slot or gap may be formed within the printed circuit board to facilitate the positioning of the at least one conductor within the opening. For example, a gap or slot may be formed between the opening and an edge of the printed circuit board.

As desired in certain embodiments of the invention, a measurements processing circuit and/or circuitry may be attached to, formed on, and/or integrated into the printed circuit board. The measurements processing circuit may include any number of suitable circuit components configured to receive and process measurements data from the Rogowski coil sections. For example, the measurements processing circuit may include suitable circuit components configured to process a received voltage signal in order to determine and/or calculate a current signal present on at least one conductor monitored by the Rogowski coil sections. In other embodiments, at least one connector may be attached to, formed on, and/or integrated into the printed circuit board. The at least one connector may be configured to provide measurements data collected by the plurality of Rogowski coil sections to an external measurements processing circuit.

Certain embodiments of the invention described herein may have the technical effect of providing a Rogowski coil assembly utilized to monitor current within at least one conductor, such as a phase conductor associated with a utility meter. By mounting a plurality of Rogowski coil sections to an external surface of a printed circuit board, the space taken up by the Rogowski coil assembly may be reduced and/or minimized. Additionally, in certain embodiments, the cost of the Rogowski coil assembly may be reduced by eliminating the need for a housing, such as a plastic housing. Further, the mounted Rogowski coil sections may provide a higher level of measurement accuracy than conventional assemblies in which Rogowski coils are fabricated or etched into printed circuit boards.

FIG. 1 is a block diagram of a plurality of example Rogowski coil assemblies, according to an illustrative embodiment of the invention. In FIG. 1, four example Rogowski coil assemblies are illustrated in association with a single printed circuit board assembly 100; however, it will be appreciated that any number of Rogowski coil assemblies may be formed on a printed circuit board. For example, a printed circuit board utilized in association with a power meter may include a Rogowski coil section for each phase conductor of the power meter.

With reference to FIG. 1, an example printed circuit board assembly 100 that includes four example Rogowski coil assemblies 110, 115, 120, 125 formed on a printed circuit board ("PCB") 105 is illustrated. The PCB 105 may be any suitable board configured to mechanically support and electrically connect the Rogowski coil sections of any number of Rogowski coil assemblies, such as the assemblies 110, 115, 120, 125 illustrated in FIG. 1. The PCB 105 may include a substrate or base formed from any number of dielectric materials including, but not limited to, polytetrafluoroethylene, FR-4, FR-1, composite epoxy material-1 ("CEM-1"), CEM-3, other fiberglass cloth materials, and/or other epoxy resin materials. As desired, the base may include a plurality of dielectric layers that are laminated together with one or more suitable epoxy resins and/or epoxy resin pre-preg materials. Any number of vias or connections may be provided between the layers. The base may also be coated or covered with a solder mask that facilitates the formation of electrical connections.

As desired, any number of circuit traces and/or conductive paths may be included in the PCB 105 or formed on the PCB 105. The circuit traces may be configured to hold the various Rogowski coil sections of a Rogowski coil assembly 110, 115, 120, 125 in place. In other words, the circuit traces may secure the Rogowski coil sections, preventing the coils from unwinding. Additionally, the circuit traces may be configured to connect the Rogowski coil sections together and/or to form a return current path for the Rogowski coil assembly. As desired, the circuit traces may also be configured to connect the Rogowski coil sections to a connector and/or to various measurements processing circuits. A few example circuit traces are described in greater detail below with reference to the example Rogowski coil assemblies 110, 115, 120, 125.

Turning to the first example Rogowski coil assembly 110, the assembly 110 may include any number of Rogowski coil sections. For example, as illustrated, the Rogowski coil assembly 110 may include six coil sections 130a-f. In other embodiments, the coil assembly may include approximately three to eight coil sections, although other numbers of coil sections may be utilized as desired. Each Rogowski coil section (individually referred to with reference numeral 130) may include a helical coil of a conductor, such as wire, that is coiled or wound on a non-magnetic core. As desired, any number of windings or coils may be formed by the conductor to create the Rogowski coil section 130. A few examples of suitable Rogowski coil sections are discussed in U.S. Patent Publication No. 2011/0025304 to Lint, et al., entitled "Current Sensing Devices and Methods" and filed Sep. 25, 2009; and in U.S. Patent Publication No. 2011/0025305 to Lint, et al., entitled "Current Sensing Devices and Methods" and filed Jan. 7, 2010. Each of these publications is incorporated by reference herein in its entirety. In certain embodiments of the invention, the Rogowski coil section 130 may include a greater number of windings or coils than can be formed by etching a Rogowski coil into a printed circuit board. In this regard, the Rogowski coil section 130 may provide relatively greater sensitivity and/or accuracy than conventional printed circuit board coil assemblies.

According to an aspect of the invention, each of the Rogowski coil sections 130 may be mounted to an external surface of the PCB 105. For example, each of the Rogowski coil sections 130 may be mounted to a surface of the PCB 105 and secured in place by one or more circuit traces. In certain embodiments, each end of a coil associated with the coil section 130 may be secured in place by a respective circuit trace. In this regard, the circuit traces may prevent the coil section 130 from unwinding. Additionally, the circuit traces may attach the coil section 130 to the PCB 105. Further, the circuit traces may connect the coil section 130 to one or more other coil sections. For example, the coil section 130 may be connected to adjacent coil sections.

Additionally, the PCB 105 may include an opening for each of the Rogowski coil assemblies 110, 115, 120, 125. Each of the openings may be configured to receive one or more respective conductors that are monitored by the Rogowski coil assemblies 110, 115, 120, 125. For example, with reference to the first coil assembly 110, an opening 135 may be provided through the PCB 105. The opening 135 may be configured to receive at least one conductor that is monitored by the first coil assembly 110, such as a phase conductor associated with a utility meter. As desired, the opening 135 may include any number of dimensions. For example, the opening 135 may be an approximately circular or an approximately elliptical opening. Other coil assemblies 115, 120, 125 may be associated with similar openings configured to receive at least one conductor.

In certain embodiments of the invention, the Rogowski coil sections 130a-f associated with a Rogowski coil assembly, such as the first assembly 110, may be formed around or about the opening 135. For example, the coil sections 130a-f may be formed around or about a periphery of the opening 135. In certain embodiments, each of the coil sections 130a-f may be positioned an approximately equal distance "d" from the center of the opening 135 (or from the edge of the opening 135). In this regard, the coil sections 130a-f may be utilized to monitor at least one conductor inserted into the opening 135.

Reference will now be made to the second Rogowski coil assembly 115 to describe example traces that may be utilized to secure and/or connect the Rogowski coil sections. The second coil assembly 115 may include components that are similar to those described above for the first coil assembly 110. For example, the second coil assembly 115 may include a plurality of Rogowski coil sections that are positioned around or about an opening within the PCB 105. Additionally, the Rogowski coil sections may be secured in place and connected via any number of suitable circuit traces. For simplicity, the same reference numerals as those utilized with respect to the first coil assembly 110 will be utilized to refer to the Rogowski coil sections of the second coil assembly 115.

As one example of circuit traces, a first circuit trace 140a may be utilized to secure one end of the first coil section 130a and to connect an end of the first coil section 130a to a corresponding end of the adjacent second coil section 130b. A second circuit trace 140b may then be utilized to secure the opposite end of the second coil section 130b and to connect the opposite end of the second coil section 130b to a corresponding end of the third coil section 130c. In a similar manner, additional circuit traces 140c-f may secure and connect the other Rogowski coil sections 130c-f. In this regard, a complete Rogowski coil circuit may be formed. A final circuit trace 140f may be utilized to secure an end of the last coil section 130f that is not connected to another coil section. Each of the circuit traces may be formed from any suitable conductive material, such as copper, another conductive metal, or a conductive alloy.

Additionally, according to an aspect of the invention, a return path may be formed for each of the Rogowski coil assemblies 110, 115, 120, 125. For example, with reference to the second coil assembly 115, a return path 145 may be formed. In certain embodiments, the return path 145 may be formed by one or more circuit traces. For example, a circuit trace may be formed on a back side of the PCB 105 or on an opposite surface of the PCB 105' from the surface on which the coil sections 130a-f are mounted. In other embodiments, the return path 145 may be formed from a conductor (e.g., a wire, etc.) that passes through the center of each of the Rogowski coil sections 130a-f. The return path 145 may reach from the last coil section 130f within a Rogowski coil circuit back to the first coil section 130a. As desired, a suitable circuit trace may be formed on the PCB 105 at the end of the return path 145 to connect the return path to another component of the Rogowski coil assembly 115, such as a measurements circuit or a connector. Additionally, a suitable circuit trace 147 may be formed to connect the other component to the first coil section 130a. In this regard, a complete Rogowski circuit may be formed that facilitates the monitoring of at least one conductor.

The other two Rogowski coil assemblies 120, 125 may include components similar to those described above for the first two coil assemblies 110, 115. For example, the third and fourth coil assemblies 120, 125 may include a plurality of Rogowski coil sections that are formed around an opening and secured and connected by a plurality of suitable circuit traces.

In certain embodiments of the invention, a suitable measurements processing circuit may be formed on the PCB 105 and associated with a Rogowski coil assembly. For example, a measurements processing circuit 150 may be associated with the first Rogowski coil assembly 110. Similarly, a measurements processing circuit 155 may be associated with the third Rogowski coil assembly 120. A measurements processing circuit 150 may include any suitable circuits and/or circuit components, such as integrators, that are configured to receive a voltage signal measured by a Rogowski coil assembly 110 and process the received voltage signal to determine a current flowing through a monitored conductor. In certain embodiments, the measurements processing circuit 150 may be attached to a surface of the PCB 105. In other embodiments, the measurements processing circuit 150 may be integrated into the PCB 105. For example, the measurements processing circuit 150 may be etched into the PCB 105.

In certain embodiments of the invention, a suitable connector may be formed on the PCB 105 and associated with a Rogowski coil assembly. For example, a connector 160 may be associated with the second Rogowski coil assembly 115. Similarly, a connector 165 may be associated with the fourth Rogowski coil assembly 125. A connector 160 may include any suitable terminators (e.g., pins, etc.) and/or associated circuit components that are configured to receive a voltage signal measured by a Rogowski coil assembly 115 and provide the received voltage signal to an external measurements processing circuit or measurements processing component. In other words, a connector 160 may provide a voltage signal to a measurements processing circuit that is not attached to the PCB 105. In certain embodiments, the connector 160 may be attached to a surface of the PCB 105.

As desired in certain embodiments, one or more gaps or slots in the PCB 105 may be utilized in association with one or more respective Rogowski coil assemblies. For example, a gap 170 may be associated with the third Rogowski coil assembly 120. Similarly, a gap 175 may be associated with the fourth Rogowski coil assembly 125. A gap 170 may be formed through the PCB 105 between an edge of the PCB 105 and an opening within the PCB 105. The gap 170 may allow at least one conductor to be easily threaded through the PCB 105 and positioned within the opening. In other words, the gap 170 may allow a Rogowski coil assembly to be easily positioned about a conductor that will be measured or monitored by the Rogowski coil assembly. In embodiments in which a gap 170 is included, any number of suitable jumpers or other connections may be utilized to connect Rogowski coil sections positioned on either side of the gap 170.

In certain embodiments of the invention, one or more suitable capacitive shields may be formed within an opening. For example, with reference to the second Rogowski coil assembly 115, a capacitive shield 180 may be formed within the opening such that the capacitive shield 180 will be positioned between the Rogowski coil sections 130a-f and at least one conductor positioned within the opening and monitored by the coil sections 130a-f. The capacitive shield 180 may include any suitable materials including, but not limited to, copper, aluminum, and/or other nonferrous conducing materials. As desired, capacitive shielding material may be used as multiple turns or layers. Alternatively, a shielding sheet may be formed. Additionally, the capacitive shield 180 may act as an electrostatic shield or a Faraday cage that reduces common mode noise on the sensors. Additionally, the capacitive shield 180 may act as a low pass filter for high frequency noise, thereby improving electromagnetic compatibility and/or electromagnetic interference ("EMC/EMI") compliance for the Rogowski coils.

As desired, embodiments of the invention may include Rogowski coil assemblies with more or less than the components illustrated in FIG. 1. The Rogowski coil assemblies 110, 115, 120, 125 illustrated in FIG. 1 are provided by way of example only and are not intended to be limiting.

FIG. 2 is a flow diagram of an example method 200 for providing a Rogowski coil assembly, according to an illustrative embodiment of the invention. The method may be utilized to provide a Rogowski coil assembly in which a plurality of Rogowski coil sections are mounted to a printed circuit board. For example, the method may be utilized to provide one of the Rogowski coil assemblies 110, 115, 120, 125 illustrated in FIG. 1. The method 200 may begin at block 205.

At block 205, a printed circuit board ("PCB"), such as the PCB 105 illustrated in FIG. 1, may be provided. According to an aspect of the invention, an opening may be provided within the PCB 105, and the opening may be configured to receive at least one conductor that will be monitored by the Rogowski coil assembly. In certain embodiments, the PCB 105 may be formed or fabricated within the opening. In other embodiments, an opening may be cut from an existing PCB. Additionally, as desired in certain embodiments of the invention, a gap may be formed within the PCB 105 to facilitate the positioning of at least one conductor within the opening. The gap may allow a Rogowski coil assembly to be positioned about the at least one conductor for monitoring purposes.

At block 210, a plurality of Rogowski coil sections, such as the Rogowski coil sections 130a-f described above with reference to FIG. 1, may be provided. Each of the Rogowski coil sections 130a-f may include a helical coil of a conductor, such as wire, that is coiled or wound on a non-magnetic core. As desired, any number of windings or coils may be formed by the conductor to create the respective Rogowski coil sections 130a-f. Together, the Rogowski coil sections 130a-f may provide a Rogowski coil that is configured to monitor at least one conductor, such as a phase conductor associated with a utility meter.

At block 215, the Rogowski coil sections 130a-f may be mounted to an external surface of the PCB 105. For example, the Rogowski coil sections 130a-f may be positioned on the external surface around the opening in the PCB 105. In certain embodiments, each of the Rogowski coil sections 130a-f may be positioned an approximately equal distance from the opening or from the center of the opening. In this regard, a relatively accurate Rogowski coil measurement assembly may be provided.

At block 220, a plurality of circuit traces may be provided to retain and/or secure the Rogowski coil sections 130a-f to the PCB 105. For example, a plurality of solder connections and/or other conductive traces may be formed on the PCB 105 to secure the Rogowski coil sections 130a-f. As desired, the ends of each of the Rogowski coil sections 130a-f may be secured to the PCB 105 by one or more suitable circuit traces. In this regard, unwinding of the Rogowski coil sections 130a-f may be prevented. Additionally, in certain embodiments of the invention, the plurality of circuit traces may be utilized to connect the various Rogowski coil sections 130a-f. For example, adjacent coil sections 130a-f may be connected to one another in order to form a Rogowski coil that is suitable for monitoring at least one conductor.

At block 225, a return current path or return path may be provided for the Rogowski coil assembly. In certain embodiments, the return path may be formed by one or more circuit traces. For example, a circuit trace may be formed on a back side of the PCB 105 or on an opposite surface of the PCB 105 from the surface on which the coil sections 130a-f are mounted. In other embodiments, the return path may be formed from a conductor (e.g., a wire, etc.) that passes through the center of each of the Rogowski coil sections 130a-f. The return path may reach from the last coil section 130f within a Rogowski coil circuit back to the first coil section.

At block 230, a connector or measurements processing circuit may be provided. For example, a suitable connector may be formed on the PCB 105 and associated with a Rogowski coil assembly. A connector may include any suitable terminators (e.g., pins, etc.) and/or associated circuit components that are configured to receive a voltage signal measured by a Rogowski coil assembly and provide the received voltage signal to an external measurements processing circuit or measurements processing component. In other words, a connector may provide a voltage signal to a measurements processing circuit that is not attached to the PCB 105.

In other embodiments, a measurements processing circuit may be formed on the PCB 105 and associated with the Rogowski coil assembly. A measurements processing circuit may include any suitable circuits and/or circuit components, such as integrators, that are configured to receive a voltage signal measured by a Rogowski coil assembly and process the received voltage signal to determine a current flowing through a monitored conductor. In certain embodiments, the measurements processing circuit may be attached to a surface of the PCB 105. In other embodiments, the measurements processing circuit 150 may be integrated into the PCB 105. For example, the measurements processing circuit 150 may be etched into the PCB 105.

The method 200 may end following block 230.

The operations described and shown in the method 200 of FIG. 2 may be carried out or performed in any suitable order as desired in various embodiments of the invention. Additionally, in certain embodiments, at least a portion of the operations may be carried out in parallel. Furthermore, in certain embodiments, less than or more than the operations described in FIG. 2 may be performed.

While the invention has been described in connection with what is presently considered to be the most practical and various embodiments, it is to be understood that the invention is not to be limited to the disclosed embodiments, but on the contrary, is intended to cover various modifications and equivalent arrangements included within the spirit and scope of the appended claims.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A Rogowski coil assembly, comprising:
   a printed circuit board;
   a plurality of Rogowski coil sections mounted to an external surface of the printed circuit board by one or more respective circuit traces, wherein the circuit traces secure each end of the plurality of Rogowski coil sections preventing the coils sections from unwinding, connect the plurality of Rogowski coil sections, and to form a return current path, wherein the return current path is formed on a surface of the printed circuit board opposite a surface on which the Rogowski coil sections are mounted;
   a substantially circular opening within the printed circuit board configured to receive at least one conductor that is monitored by the plurality of Rogowski coil sections; and
   a continuous gap in the printed circuit board connecting the opening and an edge of the printed circuit board, wherein a gap diameter of the continuous gap is substantially smaller than an opening diameter of the opening.

2. The Rogowski coil assembly of claim 1, wherein each of the plurality of Rogowski coil sections is positioned an approximately equal distance from the opening.

3. The Rogowski coil assembly of claim 1, wherein the plurality of Rogowski coil sections are positioned around the opening.

4. The Rogowski coil assembly of claim 1, further comprising:
   a capacitive shielding positioned within the opening between the printed circuit board and the at least one conductor.

5. The Rogowski coil assembly of claim 1, further comprising:
   at least one connector attached to the printed circuit board and configured to provide measurements data collected by the plurality of Rogowski coil sections to an external measurements processing circuit.

6. The Rogowski coil assembly of claim 1, further comprising:
   a measurements processing circuit attached to the printed circuit board and configured to receive measurements data collected by the plurality of Rogowski coil sections and process the received measurements data.

7. The Rogowski coil assembly of claim 1, wherein the plurality of Rogowski coil sections comprise approximately three to approximately twelve Rogowski coil sections.

8. The Rogowski coil assembly of claim 1, wherein the return current path for the plurality of Rogowski coil sections comprises one of (i) a circuit trace on the printed circuit board or (ii) a conductor that passes through the plurality of Rogowski coil sections.

* * * * *

UNITED STATES PATENT AND TRADEMARK OFFICE
CERTIFICATE OF CORRECTION

| | | |
|---|---|---|
| PATENT NO. | : 8,872,611 B2 | |
| APPLICATION NO. | : 13/212818 | |
| DATED | : October 28, 2014 | |
| INVENTOR(S) | : Rouaud et al. | |

It is certified that error appears in the above-identified patent and that said Letters Patent is hereby corrected as shown below:

Specification

In Column 5, Line 53, delete "PCB 105'" and insert -- PCB 105 --, therefor.

Signed and Sealed this
Twenty-third Day of February, 2016

Michelle K. Lee
*Director of the United States Patent and Trademark Office*